US012672457B2

(12) United States Patent
Wang et al.

(10) Patent No.: US 12,672,457 B2
(45) Date of Patent: Jun. 30, 2026

(54) STRETCHABLE DISPLAY PANEL AND MANUFACTURING METHOD THEREFOR

(71) Applicant: BOE Technology Group Co., Ltd., Beijing (CN)

(72) Inventors: Guoqiang Wang, Beijing (CN); Jinxiang Xue, Beijing (CN); Zhongyuan Sun, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 630 days.

(21) Appl. No.: 17/919,393

(22) PCT Filed: Jun. 8, 2021

(86) PCT No.: PCT/CN2021/098957
§ 371 (c)(1),
(2) Date: Oct. 17, 2022

(87) PCT Pub. No.: WO2022/017027
PCT Pub. Date: Jan. 27, 2022

(65) Prior Publication Data
US 2023/0165103 A1 May 25, 2023

(30) Foreign Application Priority Data

Jul. 21, 2020 (CN) ........................ 202010707450.X

(51) Int. Cl.
*H10K 59/38* (2023.01)
*H10K 59/12* (2023.01)
(Continued)

(52) U.S. Cl.
CPC ......... *H10K 59/38* (2023.02); *H10K 59/1201* (2023.02); *H10K 59/8792* (2023.02); *H10K 71/00* (2023.02); *H10K 2102/311* (2023.02)

(58) Field of Classification Search
CPC .... H10K 59/38; H10K 59/1201; H10K 71/00; H10K 59/8792; H10K 2102/311
(Continued)

(56) References Cited

U.S. PATENT DOCUMENTS

2008/0111484 A1* 5/2008 Kwon .................. H10K 59/123
313/506
2017/0123265 A1* 5/2017 Wang ................ G02F 1/133377
(Continued)

FOREIGN PATENT DOCUMENTS

CN        110416266 A     11/2019
CN        110739333 A      1/2020
(Continued)

OTHER PUBLICATIONS

CN 202010707450.X first office action.

*Primary Examiner* — Norman D Richards
*Assistant Examiner* — Colin Russell McCutcheon
(74) *Attorney, Agent, or Firm* — IPro, PLLC

(57) ABSTRACT

A method for fabricating a stretchable display panel includes: providing a substrate, wherein a displaying unit, a connecting unit and a hollowed-out region are provided on the substrate; forming film-layer components on the substrate, wherein orthographic projections of the film-layer components on the substrate are within the displaying unit, the connecting unit and the hollowed-out region; forming a first planarization layer on a surface of the film-layer components that is away from the substrate; forming a color-film layer on one side of the first planarization layer that is away from the substrate, wherein an orthographic projection of the color-film layer on the substrate is within the displaying unit; forming a color-film protecting layer on one side of the color-film layer that is away from the substrate; and performing an ashing process to the hollowed-out region, to (Continued)

remove the first planarization layer and the film-layer components within the hollowed-out region.

6 Claims, 6 Drawing Sheets

(51) Int. Cl.
H10K 59/80 (2023.01)
H10K 71/00 (2023.01)
H10K 102/00 (2023.01)

(58) Field of Classification Search
USPC .......................................................... 257/40
See application file for complete search history.

(56) References Cited

U.S. PATENT DOCUMENTS

| | | | |
|---|---|---|---|
| 2017/0278920 | A1 | 9/2017 | Park et al. |
| 2017/0294610 | A1* | 10/2017 | Sasaki .................. H10K 77/111 |
| 2019/0157609 | A1* | 5/2019 | Suzuki .............. H10K 50/8426 |
| 2019/0280077 | A1 | 9/2019 | Park et al. |
| 2020/0027945 | A1 | 1/2020 | Kim et al. |
| 2020/0201393 | A1* | 6/2020 | Ahn ........................ G09F 9/301 |
| 2022/0037621 | A1 | 2/2022 | Xue et al. |

FOREIGN PATENT DOCUMENTS

| | | |
|---|---|---|
| CN | 111354766 A | 6/2020 |
| CN | 111799399 A | 10/2020 |
| KR | 20190139598 A | 12/2019 |

* cited by examiner

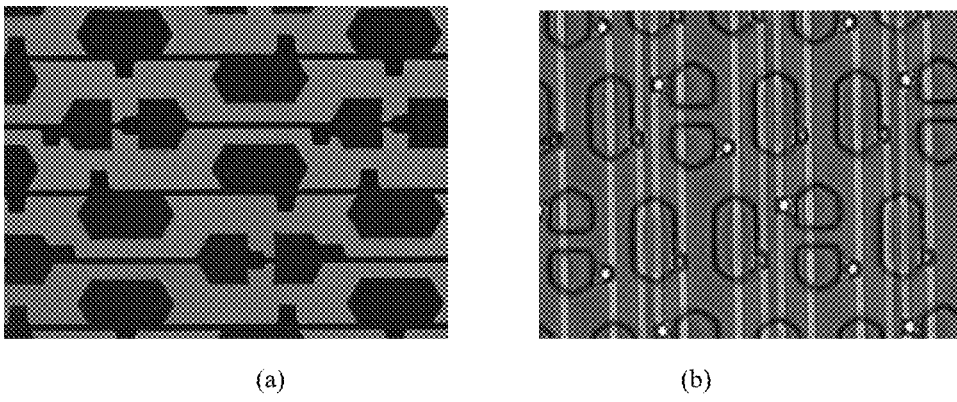

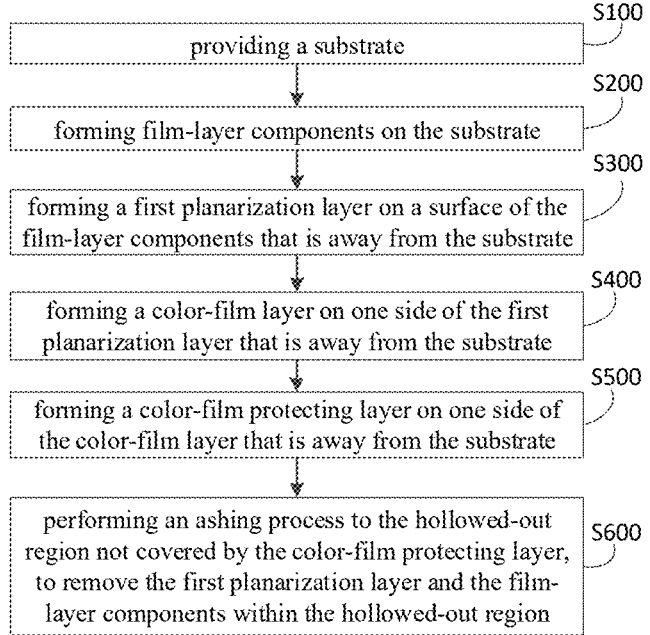

| | |
|---|---|
| providing a substrate | S100 |
| forming film-layer components on the substrate | S200 |
| forming a first planarization layer on a surface of the film-layer components that is away from the substrate | S300 |
| forming a color-film layer on one side of the first planarization layer that is away from the substrate | S400 |
| forming a color-film protecting layer on one side of the color-film layer that is away from the substrate | S500 |
| performing an ashing process to the hollowed-out region not covered by the color-film protecting layer, to remove the first planarization layer and the film-layer components within the hollowed-out region | S600 |

FIG. 2

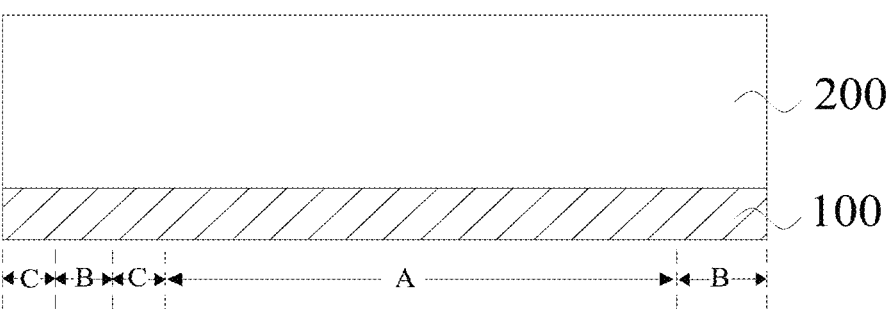

STRETCHABLE DISPLAY PANEL AND MANUFACTURING METHOD THEREFOR

PRIORITY INFORMATION

The present application claims the priority and the benefit of the patent application filed before the China National Intellectual Property Administration on Jul. 21, 2020 with the application number of 202010707450.X, which is incorporated herein in its entirety by reference.

TECHNICAL FIELD

The present disclosure relates to the technical field of stretchable displaying and more particularly, to a stretchable display panel and a fabricating method thereof.

BACKGROUND

Stretchable displaying, as novel displaying devices, has an effect of displaying of a high stretchability and a high resolution. Stretchable displaying employs the connection mode of islands (the displaying units) and bridges (the connecting units), and hollowed-out regions are formed within the displaying region to provide the stretchability. Currently, it has not been found that any conventional stretchable component employs the structure of a color film on the luminescent base plate (COE).

SUMMARY

The present disclosure is made on the basis of the following finding of the inventor:

The inventor of the present disclosure has found by study that, in a method for fabricating a stretchable displaying component of a color film in a displaying base plate (COE), a hollowing-out process may be performed by using a color-film protecting layer (CF Cover) as the hard mask after the color-film layer (CF) is completed, which may effectively prevent the influence on the low-temperature polycrystalline-silicon (LTPS) thin-film-transistor (TFT) characteristic by the deposition of the columnar-supportor protecting layer (PS Cover), and the damaging on the anode by the etching of a second anode sublayer (AND2).

In the first aspect of the present disclosure, the present disclosure provides a method for fabricating a stretchable display panel.

According to an embodiment of the present disclosure, the method includes:

providing a substrate, wherein a displaying unit, a connecting unit and a hollowed-out region are provided on the substrate, and the hollowed-out region is provided between the displaying unit and the connecting unit;

forming film-layer components on the substrate, wherein orthographic projections of the film-layer components on the substrate are within the displaying unit, the connecting unit and the hollowed-out region;

forming a first planarization layer on a surface of the film-layer components that is away from the substrate;

forming a color-film layer on one side of the first planarization layer that is away from the substrate, wherein an orthographic projection of the color-film layer on the substrate is within the displaying unit;

forming a color-film protecting layer on one side of the color-film layer that is away from the substrate, wherein the color-film protecting layer covers the displaying unit and the connecting unit; and performing an ashing process to the hollowed-out region not covered by the color-film protecting layer, to remove the first planarization layer and the film-layer components within the hollowed-out region.

By using the method for fabricating a stretchable display panel according to the embodiment of the present disclosure, not only the color-film layer may be fabricated on one side of the luminescent base plate, but also the color-film protecting layer is used as the hard mask to perform the ashing process to form the hollowed-out region, which may effectively prevent the influence on the low-temperature polycrystalline-silicon thin-film-transistor characteristic by the deposition of the columnar-supportor protecting layer, and the damaging on the anode by the etching.

Furthermore, the fabricating method according to the above embodiment of the present disclosure may also have the following additional technical features:

according to an embodiment of the present disclosure, the method further includes: forming a black-matrix layer between the color-film layer and the color-film protecting layer, wherein the black-matrix layer covers part of the color-film layer; and stripping the substrate from the film-layer components, and adhering a back film to a surface of the film-layer components that is away from the color-film layer.

According to an embodiment of the present disclosure, the step of forming the film-layer components includes:

forming a flexible matrix, a flexible-matrix protecting layer, a thin-film-transistor component and a second planarization layer on the substrate, wherein the thin-film-transistor component is formed in the displaying unit;

forming a source-drain-electrode protecting layer on a surface of the thin-film-transistor component that is away from the substrate; and forming an organic luminescent component and a columnar supportor on a surface of the thin-film-transistor component that is away from the substrate, wherein both of orthographic projections on the substrate of the organic luminescent component and the columnar supportor are within the displaying unit.

According to an embodiment of the present disclosure, the step of forming the organic luminescent component includes:

forming a luminescent layer by vacuum evaporation of an opening mask, wherein the luminescent layer is formed by using a white-light organic luminescent material.

According to an embodiment of the present disclosure, the orthographic projection of the color-film layer on the substrate and an orthographic projection of the luminescent layer on the substrate overlap.

According to an embodiment of the present disclosure, the first planarization layer directly covers a surface of the columnar supportor that is away from the substrate.

According to an embodiment of the present disclosure, an anode of the organic-light-emitting-diode component is formed in one step.

In the second aspect of the present disclosure, the present disclosure provides a stretchable display panel.

According to an embodiment of the present disclosure, the stretchable display panel includes a displaying unit, a connecting unit and a hollowed-out region, the hollowed-out region is provided between the displaying unit and the connecting unit, and the stretchable display panel includes:

film-layer components, wherein the film-layer components are in the displaying unit and the connecting unit;

a first planarization layer, wherein the first planarization layer is provided on one side of the film-layer components, and an orthographic projection of the first planarization layer on the film-layer components are within the displaying unit and the connecting unit;

a color-film layer, wherein the color-film layer is provided on one side of the first planarization layer that is away from the film-layer components, and an orthographic projection of the color-film layer on the film-layer components is within the displaying unit; and a color-film protecting layer, wherein the color-film protecting layer is provided on one side of the color-film layer that is away from the film-layer components, and covers the displaying unit and the connecting unit.

In the stretchable display panel according to the embodiment of the present disclosure, the hollowed-out region is formed by using an ashing process using the color-film protecting layer as the hard mask, which can result in a good low-temperature polycrystalline-silicon thin-film-transistor characteristic and little damaging on the anode, thereby resulting in a high fabrication yield of the stretchable display panel. In addition, the color-film layer may also be provided on one side of a luminescent base plate, to enable the display panel to have a lower thickness.

Furthermore, the stretchable display panel according to the above embodiment of the present disclosure may also have the following additional technical features:

according to an embodiment of the present disclosure, the stretchable display panel further includes:

a substrate, wherein the substrate is provided on a surface of the film-layer components that is away from the first planarization layer.

According to an embodiment of the present disclosure, the stretchable display panel further includes:

a back film, wherein the back film is adhered to a surface of the film-layer components that is away from the first planarization layer.

According to an embodiment of the present disclosure, the film-layer components include a flexible matrix, a flexible-matrix protecting layer, a thin-film-transistor component, a second planarization layer, a source-drain-electrode protecting layer, an organic luminescent component and a columnar supportor that are arranged in stack, orthographic projections of the flexible matrix, the flexible-matrix protecting layer and the second planarization layer on the film-layer components are within the displaying unit and the connecting unit, and orthographic projections of the thin-film-transistor component, the organic luminescent component and the columnar supportor on the film-layer components are within the displaying unit.

According to an embodiment of the present disclosure, a luminescent layer of the organic luminescent component is formed by using a white-light organic luminescent material, and an orthographic projection of the color-film layer on the film-layer components and an orthographic projection of the luminescent layer on the film-layer components overlap.

According to an embodiment of the present disclosure, the first planarization layer directly covers a surface of the columnar supportor that is away from the flexible matrix.

According to an embodiment of the present disclosure, an anode of the organic-light-emitting-diode component is formed by using an integral material.

Some of the additional aspects and advantages of the present disclosure will be given in the following description, and some will become apparent from the following description or be known from the implementation of the present disclosure.

BRIEF DESCRIPTION OF THE DRAWINGS

The above aspects of the present disclosure will be explained with reference to the following description on the drawings and the embodiments. In the drawings:

FIG. 1 is photographs of a normal anode (a) and a damaged anode (b) where the silver disappears;

FIG. 2 is a schematic flow chart of a method for fabricating a stretchable display panel according to an embodiment of the present disclosure;

FIG. 3 is a schematic cross-sectional structural diagram of the product of the step S200 of a fabricating method according to an embodiment of the present disclosure;

Figure 4:
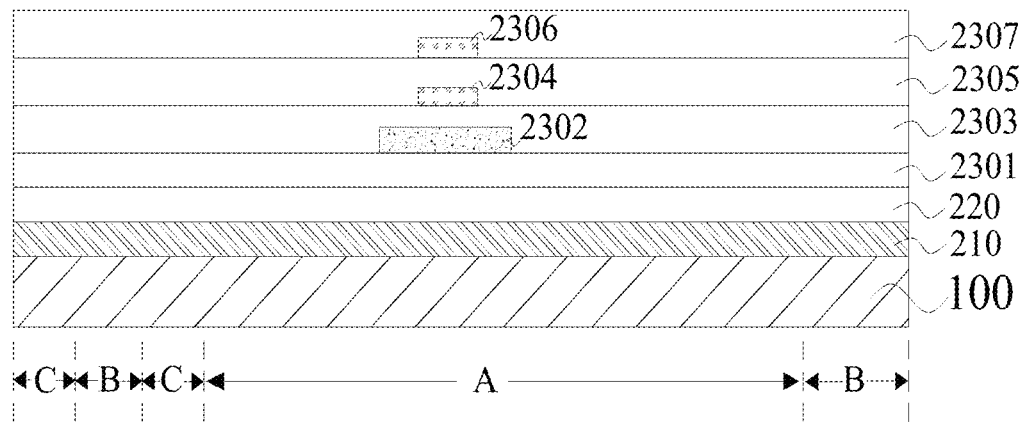
FIG. 4 is a schematic cross-sectional structural diagram of the product of the step S200 of a fabricating method according to another embodiment of the present disclosure.

REFERENCE NUMBERS 100 substrate
200 film-layer components
210 flexible matrix
220 flexible-matrix protecting layer
2301 buffer layer
2302 active layer
2303 first grid insulating layer
2304 first grid
2305 second grid insulating layer
2306 second grid insulating layer
2307 interlayer dielectric layer 2308 source-drain electrode
241 second planarization layer
242 third planarization layer
250 source-drain-electrode protecting layer
251 slot
260 fourth planarization layer
2701 anode
2702 pixel definition layer
2703 luminescent layer
2704 cathode
280 columnar supportor
300 first planarization layer
400 color-film layer
500 color-film protecting layer
600 black-matrix layer
700 organic adhesive layer
800 back film

DETAILED DESCRIPTION

The embodiments of the present disclosure will be described in detail below. A person skilled in the art can understand that the following embodiments are intended to interpret the present disclosure, and should not be deemed as a limitation on the present disclosure. Unless indicated particularly, where the particular techniques or conditions of an embodiment in the following are not clearly described, a person skilled in the art may implement the embodiment by using commonly used techniques or conditions in the art or according to the specification of the product.

In an aspect of the present disclosure, the present disclosure provides a method for fabricating a stretchable display panel. According to an embodiment of the present disclosure, referring to FIG. 2, the fabricating method includes:

S100: providing a substrate.

In this step, the substrate 100 is provided, a displaying unit A, a connecting unit B and a hollowed-out region C are provided on the substrate 100, and the hollowed-out region C is provided between the displaying unit A and the connecting unit B.

The inventor of the present disclosure has found by long-term study that the current red-blue-green (RBG) stretchable displaying components, as compared with the conventional fabricating processes of RBG organic light emitting diode (OLED) components, require being additionally added a source-drain-electrode protecting layer (SD Cover) and a PS Cover. However, after a hollowing-out process using a PS Cover as the hard mask (Hard Mask) is performed to form a hollowed-out region, it is further required to etch the AND2 on the surface of the PS Cover that is away from the first anode sublayer (AND1). However, an etching-atmosphere over-etching damages the indium tin oxide (ITO) in the AND1, and the subsequent basic-etchant process further damages the silver (Ag) in the AND1, which easily results in displaying imperfects. Moreover, the additionally added SD Cover and PS Cover of a silicon-nitride material result in the problem of LTPS TFT characteristic drifting.

Additionally, the luminescent layers of the three colors in the RBG stretchable displaying components require to be vacuum evaporated individually by using Fine Metal Masks (FMM), and the hollowed-out parts of the FMM are not evenly distributed, which easily results in nonuniform deformation of the FMM during stowing net, thereby resulting in RGB color mixing of the displaying units.

In some embodiments of the present disclosure, the substrate 100 may include a plurality of displaying units A that are arranged in an array, and each of the displaying units A may be formed by a plurality of pixel units. Moreover, the substrate 100 may further include a plurality of connecting units B, and a connecting unit B is provided between each two neighboring displaying units A. Additionally, the hollowed-out region C is provided between each of the displaying units A and a connecting unit B. That may enable the finally fabricated stretchable display panel to have both of a stretchability and a displaying performance.

S200: forming film-layer components on the substrate.

In this step, referring to FIG. 3, film-layer components 200 are formed on the substrate 100, and the orthographic projections of the film-layer components 200 on the substrate 100 are within the displaying unit A, the connecting unit B and the hollowed-out region C.

In some embodiments of the present disclosure, referring to FIGS. 4-8, the step S200 may include: S210 forming a flexible matrix 210, a flexible-matrix protecting layer 220, a thin-film-transistor component and a second planarization layer 241 on the substrate 100, wherein the thin-film-transistor component is formed in the displaying unit A; S220 forming a source-drain-electrode protecting layer 250 on the surface of the thin-film-transistor component that is away from the substrate 100; and S230 forming an organic luminescent component and a columnar supportor 280 on the surface of the thin-film-transistor component that is away from the substrate 100, wherein both of the orthographic projections on the substrate 100 of the organic luminescent component and the columnar supportor 280 are within the displaying unit A. Accordingly, a luminescent (EL) base plate of improved structure and functions may be fabricated.

In some particular embodiments, the material for forming the luminescent layer 2703 of the organic luminescent component may be merely selected to be a white-light organic luminescent material. Accordingly, the luminescent layer may be formed by merely using one-step vacuum evaporation of an opening mask (Open Mask), which, as compared with the design of RGB displaying, requires merely one time of the vacuum evaporation process, to obtain a lower vacuum evaporation cost and prevent the problem of color mixing of color-separation vacuum evaporation.

Figure 5:
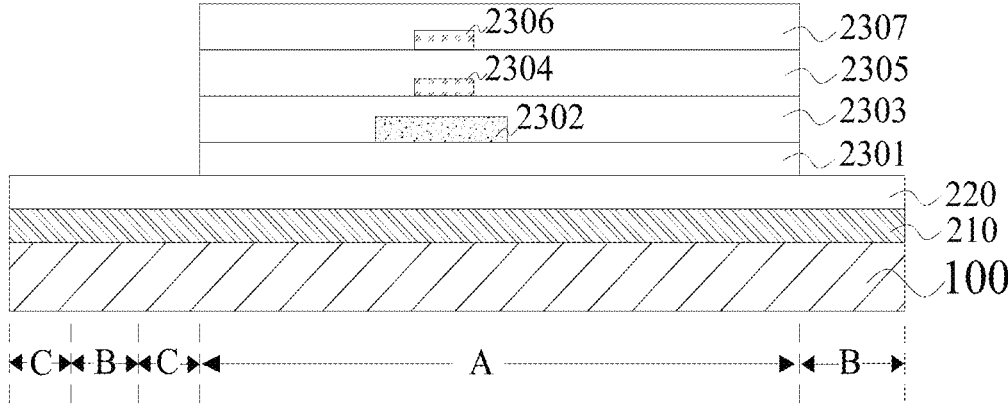
FIG. 5 is a schematic cross-sectional structural diagram of the semi-finished product of the step S200 of a fabricating method according to another embodiment of the present disclosure.
Figure 6:
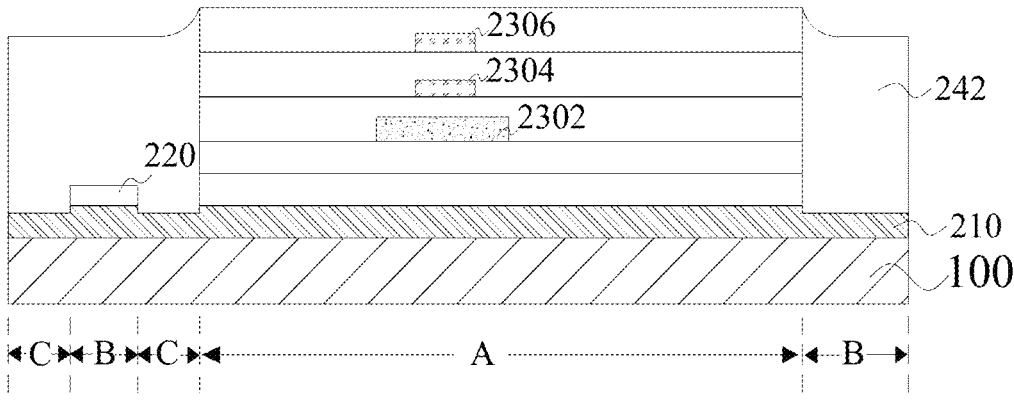
FIG. 6 is a schematic cross-sectional structural diagram of the semi-finished product of the step S200 of a fabricating method according to another embodiment of the present disclosure.
Figure 7:
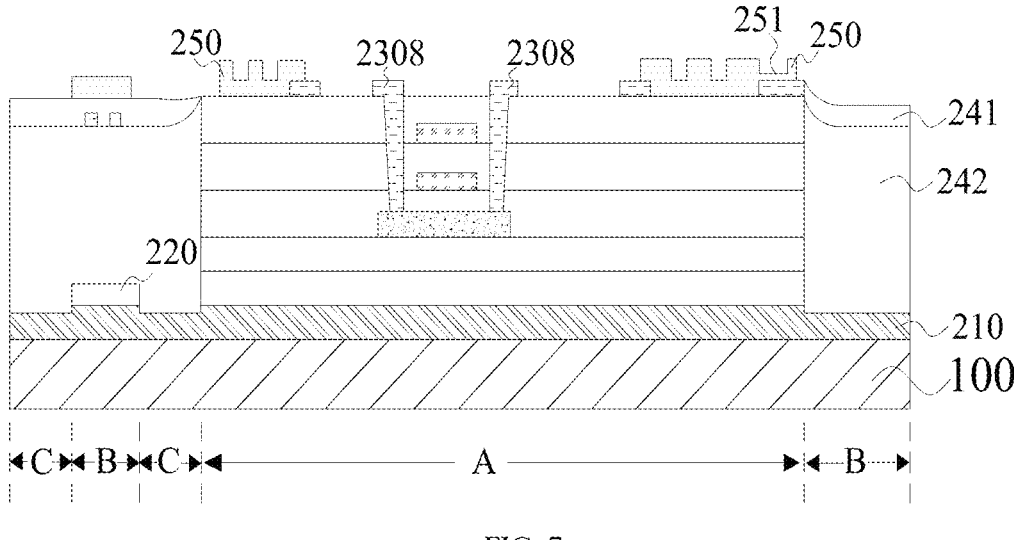
FIG. 7 is a schematic cross-sectional structural diagram of the semi-finished product of the step S200 of a fabricating method according to another embodiment of the present disclosure.
Figure 15:
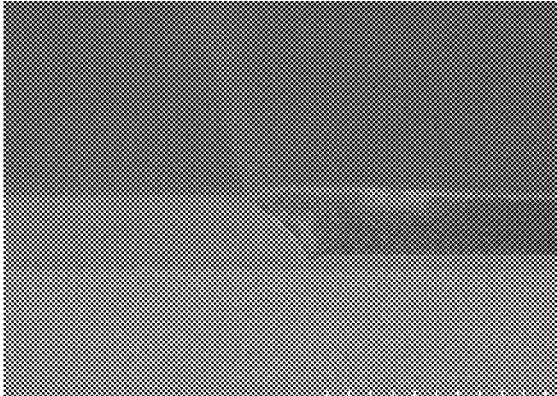
FIG. 15 is an electron-microscope photograph of a cross section of a third planarization layer after filled according to an embodiment of the present disclosure.

Particularly, the step of forming the thin-film-transistor component may include the following. Referring to FIG. 4, a buffer layer 2301, an active layer 2302, a first grid insulating layer 2303, a first grid 2304, a second grid insulating layer 2305, a second grid insulating layer 2306 and an interlayer dielectric layer 2307 are formed sequentially on the surface of the flexible-matrix protecting layer 220 that is away from the substrate 100. Referring to FIG. 5, subsequently, etching of the first time (EP1) is performed to remove the buffer layer 2301, the first grid insulating layer 2303, the second grid insulating layer 2305 and the interlayer dielectric layer 2307 in the area outside the displaying unit A. Subsequently, etching of the second time (EP2) is performed to remove the flexible-matrix protecting layer 220 within the hollowed-out region C. Referring to FIG. 6, subsequently, the area outside the displaying unit A is filled with an organic material to form a third planarization layer 242, which may reduce offset. Referring to FIG. 15, the thickness of the third planarization layer 242 may be 1-2 micrometers. Subsequently, a via hole in the area of the active layer 2302 is formed. The via hole penetrates the first grid insulating layer 2303, the second grid insulating layer 2305 and the interlayer dielectric layer 2307, which may enable the formed source-drain electrode 2308 to contact the active layer 2302 via the via hole. Subsequently, the area outside the displaying unit A continues to be filled with an organic material to form a second passivation layer 241, to coat the data lines (SD lines). Accordingly, because the third planarization layer 242 and the second passivation layer 241 sandwich the SD lines therebetween, the SD lines may be cushioned in stretching, thereby further increasing the stretchable amount of the display panel. Particularly, when the stretching amount is 5%, no crack emerges, and when the stretching amount reaches 10%, slightly cracks emerge. Referring to FIG. 7, the source-drain-electrode protecting layer 250 is deposited on the surface of the interlayer dielectric layer 2307 that is away from the substrate 100, wherein merely the covered part of the source-drain electrode 2308 may provide a packaging cross section for the subsequent packaging, and prevent bad contact between the inorganic layer and the organic layer of the packaging. Subsequently, a slot (Dam) 251 is formed on the source-drain-electrode protecting layer 250, which can increase the paths of oxygen water invasion and improve the packaging reliability, and can also increase the stability of the inversed-trapezoidal PS and prevent falling.

Figure 8:
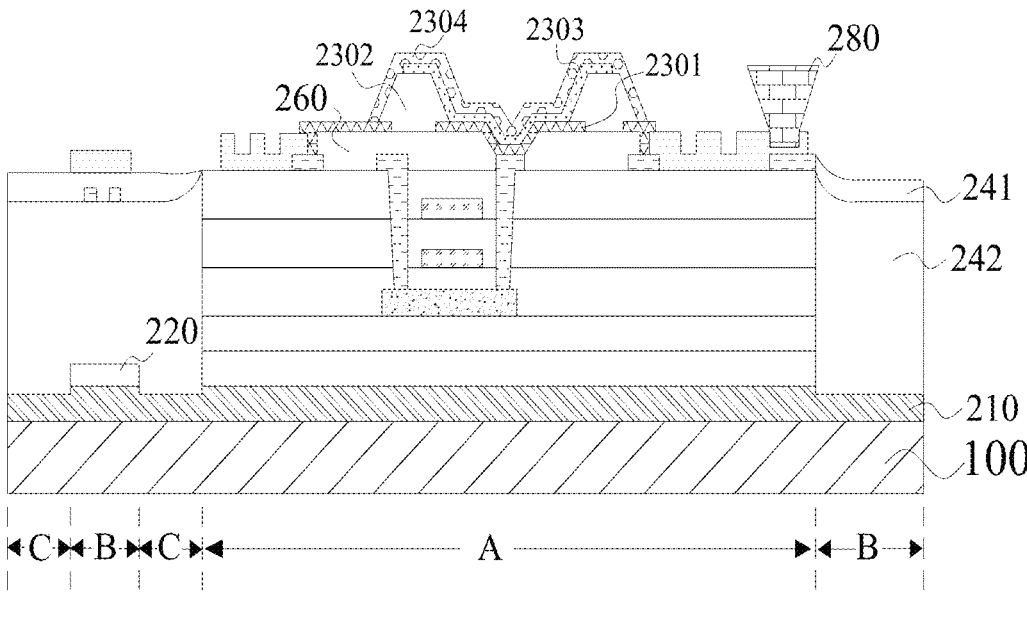
FIG. 8 is a schematic cross-sectional structural diagram of the semi-finished product of the step S200 of a fabricating method according to another embodiment of the present disclosure.

Particularly, referring to FIG. 8, the step of forming the organic luminescent component may include: forming a fourth planarization layer 260 on the surface of the source-drain electrode 2308 that is away from the substrate 100, to provide a planarization interface for the anode; subsequently, forming the anode 2701 on the surface of the fourth planarization layer 260 that is away from the substrate 100; subsequently, forming a pixel definition layer 2702 on the surfaces of the anode 2701 and the fourth planarization layer 260 that are away from the substrate 100; subsequently, fabricating an inversed-trapezoidal columnar cushion (PS) 280 on the slot 251, to form a blocking component; subsequently, forming the luminescent layer 2703 on the surfaces of the pixel definition layer 2702 and the anode 2701 that are away from the substrate 100; and finally, forming a cathode 2704 on the surface of the luminescent layer 2703 that is away from the substrate 100.

The anode 2701 of the organic-light-emitting-diode component may be formed in one step. Accordingly, it is not required to subsequently fabricate a columnar-suppotor protecting layer (PS Cover) as the hard mask for the formation of the hollowed-out region C, and therefore it is not required to fabricate a second anode sublayer (AND2), thereby effectively preventing damaging to the anode 2701 by AND2 etching, which results in a high fabrication yield of the stretchable display panel.

S300: forming a first planarization layer on a surface of the film-layer components that is away from the substrate.

In this step, a first planarization layer 300 is formed on the surface of the film-layer components 200 that is away from the substrate 100.

Figure 10:
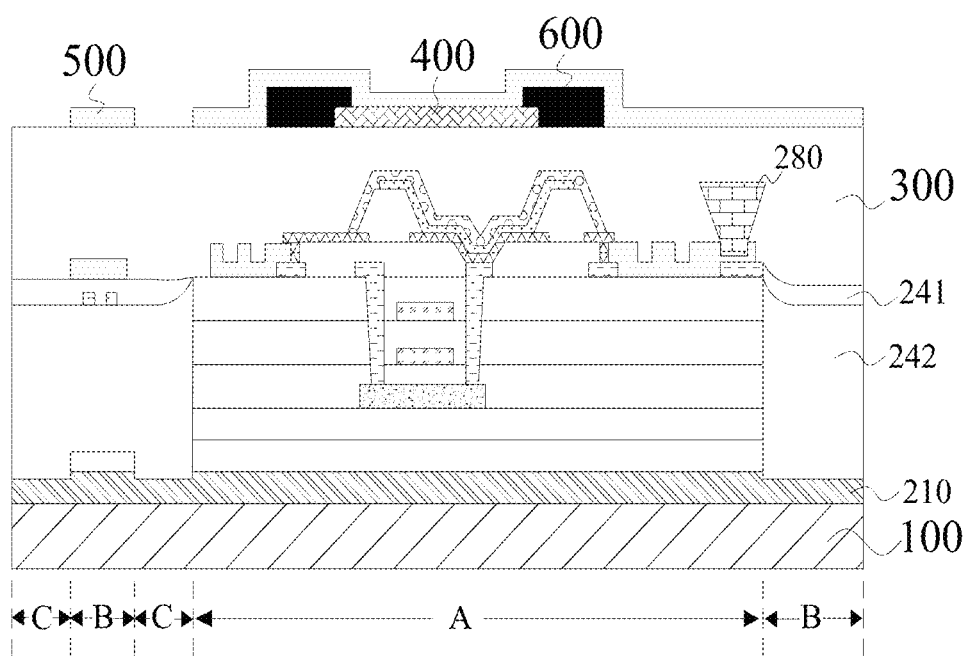
FIG. 10 is a schematic cross-sectional structural diagram of the product of the step S500 of a fabricating method according to another embodiment of the present disclosure.

In some embodiments of the present disclosure, referring to FIG. 10, the first planarization layer 300 may directly cover the surface of the columnar supportor 280 in the film-layer components 200 that is away from the substrate 100. Accordingly, in the fabricating method, it is not required to additionally fabricate a PS Cover and an AND2 on the surface of the columnar supportor 280 that is away from the substrate 100, and the hollowed-out region C can still be hollowed out by using the subsequently fabricated color-film protecting layer (CF Cover) 500 as the hard mask, thereby effectively preventing the LTPS TFT characteristic drifting caused by the PS Cover of a silicon-nitride material, which results in a high fabrication yield of the stretchable display panel.

S400: forming a color-film layer on one side of the first planarization layer that is away from the substrate.

In this step, a color-film layer 400 is formed on the side of the first planarization layer 300 that is away from the substrate, and the orthographic projection of the color-film layer 400 on the substrate 100 is within the displaying unit A.

In some embodiments of the present disclosure, the orthographic projection of the color-film layer 400 on the substrate 100 and the orthographic projection of the luminescent layer 2703 on the substrate 100 may overlap. Particularly, the orthographic projection of the color-film layer 400 on the substrate 100 may be within the orthographic projection of the luminescent layer 2703 on the substrate 100. Accordingly, the white light emitted by the luminescent layer 2703 may be modulated by the color-film layer 400 of a red color, a blue color or a green color, and color lights are emitted from the stretchable display panel.

In some embodiments of the present disclosure, a black-matrix layer 600 may be formed on the surface of the color-film layer 400 that is away from the substrate 100, and the black-matrix layer 600 between the color-film layer 400 and the color-film protecting layer 500 may cover part of the color-film layer 400. Accordingly, not only the color-film layer 400 is fabricated on one side of the luminescent base plate, but also the black-matrix layer 600 for preventing light leakage is also fabricated on one side of the luminescent base plate, which can enable the stretchable display panel to have a better effect of displaying.

S500: forming a color-film protecting layer on one side of the color-film layer that is away from the substrate.

Figure 9:
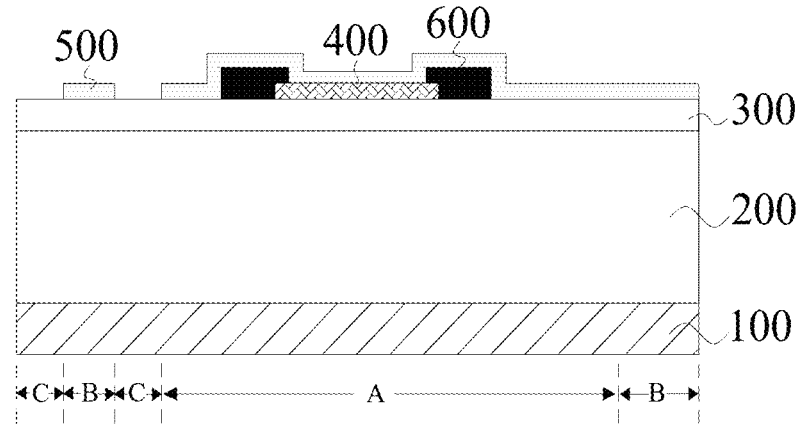
FIG. 9 is a schematic cross-sectional structural diagram of the product of the step S500 of a fabricating method according to an embodiment of the present disclosure.

In this step, referring to FIG. 9, a color-film protecting layer 500 is formed on the side of the color-film layer 400 that is away from the substrate 100, and the color-film protecting layer 500 merely covers the displaying unit A and the connecting unit B. accordingly, the hollowed-out region C is not covered by the color-film protecting layer 500. According to an embodiment of the present disclosure, the material forming the color-film protecting layer 500 may be silicon nitride (SiN). Accordingly, the color-film protecting layer 500 using that material can better prevent atmosphere damaging on the color-film layer 300, the black-matrix layer 400 and part of the film-layer components 200 by the subsequent ashing process.

S600: performing an ashing process to the hollowed-out region not covered by the color-film protecting layer, to remove the first planarization layer and the film-layer components within the hollowed-out region.

Figure 11:
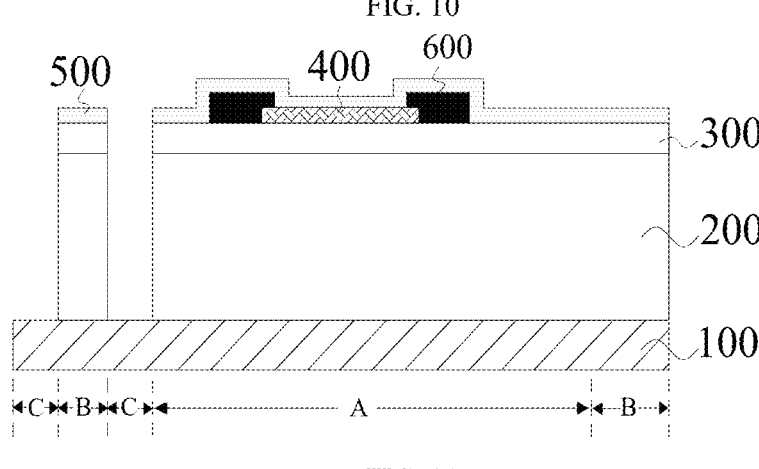
FIG. 11 is a schematic cross-sectional structural diagram of the product of the step S600 of a fabricating method according to an embodiment of the present disclosure.
Figure 12:
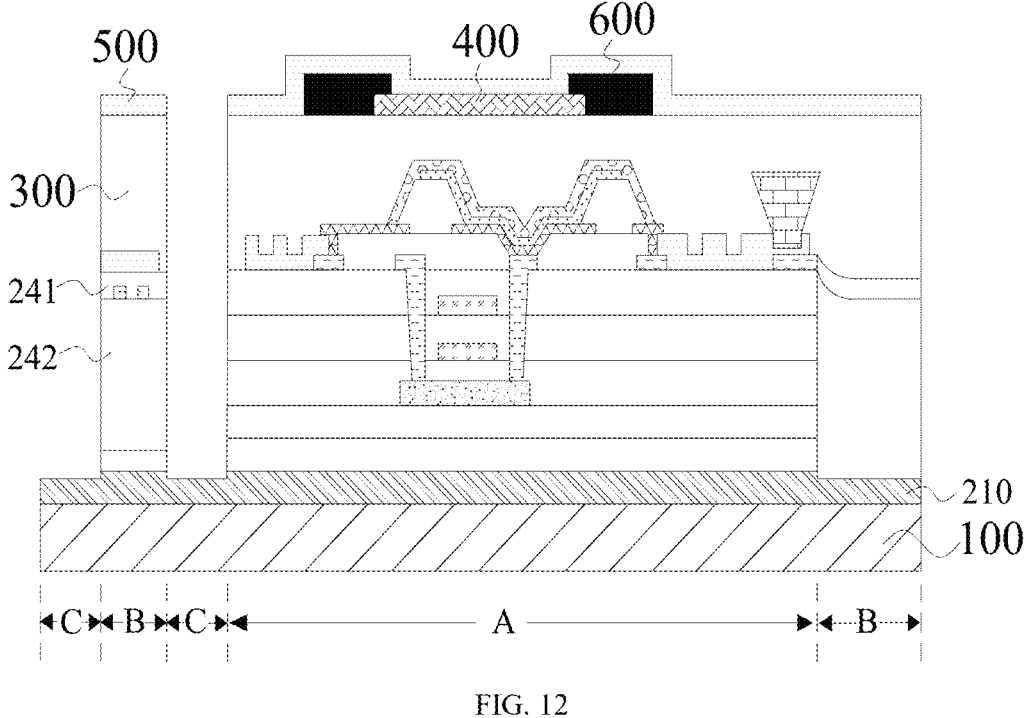
FIG. 12 is a schematic cross-sectional structural diagram of the product of the step S700 of a fabricating method according to an embodiment of the present disclosure.

In this step, referring to FIG. 11, an ashing process is performed to the hollowed-out region C not covered by the color-film protecting layer 500, to remove the first planarization layer 300 and the film-layer components 200 within the hollowed-out region C. Particularly, the ashing process may be performed by means of an oxygen plasma (O Plasma). Accordingly, by removing the organic material within the hollowed-out region C by using the high-energy plasma, the fabricated hollowed-out region C can have little residue and spend a short time. In some embodiments of the present disclosure, referring to FIG. 12, the ashing process may remove the first planarization layer 300, the second planarization layer 241 and the third planarization layer 242 within the hollowed-out region C. Accordingly, the organic film layers formed by the organic material within the hollowed-out region C are thoroughly removed by the oxygen plasma.

In some embodiments of the present disclosure, after the step S600, the fabricating method may further include:

S700: stripping the substrate from the film-layer components, and adhering a back film to a surface of the film-layer components that is away from the color-film layer.

In this step, referring to FIG. 13, the substrate 100 is stripped from the film-layer components 200, and subsequently, referring to FIG. 14, a back film 800 is adhered to the lower surface of the film-layer components 200 by using an organic adhesive layer 700. Accordingly, the fabrication of the stretchable display panel can be completed.

In conclusion, according to the embodiments of the present disclosure, the present disclosure provides a method for fabricating a stretchable display panel, wherein not only the color-film layer can be fabricated on one side of the luminescent base plate, but also the color-film protecting layer is used as the hard mask to perform the ashing process to form the hollowed-out region, which can effectively prevent the influence on the low-temperature polycrystalline-silicon thin-film-transistor characteristic by the deposition of the columnar-supportor protecting layer, and the damaging on the anode by a basic etchant.

In another aspect of the present disclosure, the present disclosure provides a stretchable display panel.

Figure 13:
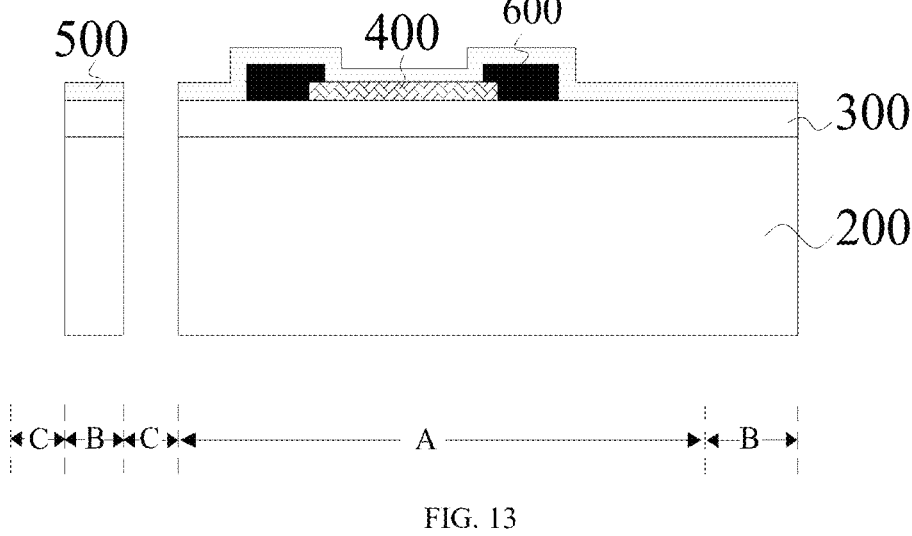
FIG. 13 is a schematic cross-sectional structural diagram of a stretchable display panel according to an embodiment of the present disclosure.

According to an embodiment of the present disclosure, referring to FIG. 13, the stretchable display panel includes a displaying unit A, a connecting unit B and a hollowed-out region C, the hollowed-out region C is provided between the displaying unit A and the connecting unit B, and the stretchable display panel includes: film-layer components 200, a first planarization layer 300, a color-film layer 400 and a color-film protecting layer 500. The film-layer components 200 are in the displaying unit A and the connecting unit B. The first planarization layer 300 is provided on one side of the film-layer components 200, and the orthographic projection of the first planarization layer 300 on the film-layer components 200 are within the displaying unit A and the connecting unit B. The color-film layer 400 is provided on the side of the first planarization layer 300 that is away from the film-layer components 200, and the orthographic projection of the color-film layer 400 on the film-layer components 200 is within the displaying unit A. The color-film protecting layer 500 is provided on the side of the color-film layer 400 that is away from the film-layer components 200, and the color-film protecting layer 500 covers the displaying unit A and the connecting unit B. Accordingly, the hollowed-out region C of the stretchable display panel is formed by a hollowing-out process by using the color-film protecting layer 500 as the mask, and the color-film protecting layer 500 is completely the same as the sum of the shapes of the displaying unit A and the connecting unit B, which can effectively prevent the influence on the low-temperature polycrystalline-silicon thin-film-transistor characteristic by the deposition of the columnar-supportor protecting layer, and the damaging on the anode by the etching.

In some embodiments of the present disclosure, the stretchable display panel may include a plurality of displaying units A that are arranged in an array, and each of the displaying units A may be formed by a plurality of pixel units. Moreover, the stretchable display panel may further include a plurality of connecting units B, and a connecting unit B is provided between each two neighboring displaying units A. Additionally, the hollowed-out region C is provided between each of the displaying units A and a connecting unit B. That can enable the stretchable display panel to have both of a stretchability and a displaying performance.

In some embodiments of the present disclosure, referring to FIG. 11, the stretchable display panel may further include a substrate 100, and the substrate 100 is provided on the surface of the film-layer components 200 that is away from the first planarization layer 300. Accordingly, in the fabrication of the stretchable display panel, the hard substrate 100 can provide good supporting and smoothness for the fabrication.

Figure 14:
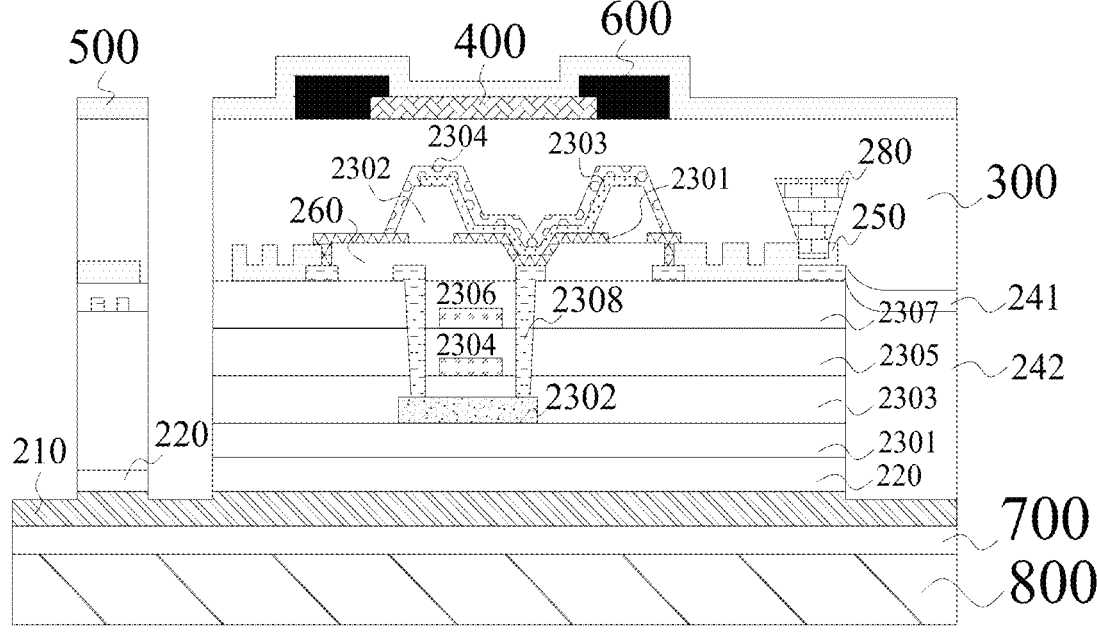
FIG. 14 is a schematic cross-sectional structural diagram of a stretchable display panel according to another embodiment of the present disclosure.

In some other embodiments of the present disclosure, referring to FIG. 14, the stretchable display panel may further include a back film 800, and the back film 800 is adhered to the surface of the film-layer components 200 that is away from the first planarization layer 300 by using an organic adhesive layer 700. Accordingly, the stretching-resistance performance of the display panel can be better.

According to an embodiment of the present disclosure, referring to FIG. 14, the film-layer components 200 may include a flexible matrix 210, a flexible-matrix protecting layer 220, a thin-film-transistor component, a second planarization layer 240, a source-drain-electrode protecting layer 250, an organic luminescent component and a columnar supportor 280 that are arranged in stack, the orthographic projections of the flexible matrix 210, the flexible-matrix protecting layer 220 and the second planarization layer 240 on the film-layer components 200 are within the displaying unit A and the connecting unit B, and the orthographic projections of the thin-film-transistor component, the organic luminescent component and the columnar supportor 280 on the film-layer components 200 are within the displaying unit A.

In some embodiments of the present disclosure, a luminescent layer 2703 of the organic luminescent component may be formed by using a white-light organic luminescent material, and the orthographic projection of the color-film layer 400 on the film-layer components 200 and the orthographic projection of the luminescent layer 2703 on the film-layer components 200 overlap. Particularly, the orthographic projection of the color-film layer 400 on the substrate 100 may be within the orthographic projection of the luminescent layer 2703 on the substrate 100. Accordingly, it is not required to fabricate a columnar-supportor protecting layer (PS Cover) as the hard mask for the formation of the hollowed-out region C, and therefore it is not required to fabricate a second anode sublayer (AND2), thereby effectively preventing damaging to the anode 2701 by AND2 etching, which results in a high fabrication yield of the stretchable display panel.

In addition, the white light emitted by the luminescent layer 2703 may be modulated by the color-film layer 400 of a red color, a blue color or a green color, and color lights are emitted from the stretchable display panel.

In some embodiments of the present disclosure, referring to FIG. 14, the first planarization layer 300 may directly cover the surface of the columnar supportor 200 in the film-layer components 200 that is away from the flexible matrix 210. Accordingly, it is not required to additionally fabricate a columnar-supportor protecting layer (PS Cover) and a second anode sublayer (AND2) on the surface of the columnar supportor 280 that is away from the substrate 100, and the hollowed-out region C can still be hollowed out by using the subsequently fabricated color-film protecting layer (CF Cover) 500 as the hard mask, thereby effectively preventing the LTPS TFT characteristic drifting caused by the PS Cover of a silicon-nitride material, which results in a high fabrication yield of the stretchable display panel.

In some embodiments of the present disclosure, the anode 2701 of the organic-light-emitting-diode component may be formed by using an integral material. Accordingly, it is not required to fabricate a PS Cover as the hard mask for the formation of the hollowed-out region C, and therefore it is not required to fabricate an AND2, thereby effectively preventing damaging to the anode 2701 by AND2 etching, which results in a high fabrication yield of the stretchable display panel.

In conclusion, according to the embodiments of the present disclosure, the present disclosure provides a stretchable display panel, wherein the hollowed-out region is formed by using an ashing process using the color-film protecting layer as the hard mask, which can result in a good low-temperature polycrystalline-silicon thin-film-transistor characteristic and little damaging on the anode, thereby resulting in a high fabrication yield of the stretchable display panel. In addition, the color-film layer may also be provided on one side of a luminescent base plate, to enable the display panel to have a lower thickness.

In the description of the present disclosure, it should be understood that the terms "first", "second", "third" and "fourth" are merely for the purpose of describing, and should not be construed as indicating or implying the degrees of importance or implicitly indicating the quantity of the specified technical features. Accordingly, the features defined by "first", "second", "third" and "fourth" may explicitly or implicitly comprise at least one of the features. In the description of the present disclosure, the meaning of "plurality of" is "at least two", for example, two, three and so on, unless explicitly and particularly defined otherwise.

In the description of the present disclosure, the description referring to the terms "an embodiment", "some embodiments", "example", "particular example" or "some examples" and so on means that particular features, structures, materials or characteristics described with reference to the embodiment or example are comprised in at least one of the embodiments or examples of the present disclosure. In the description, the illustrative expressions of the above terms do not necessarily relate to the same embodiment or example. Furthermore, the described particular features, structures, materials or characteristics may be combined in one or more embodiments or examples in a suitable form. Moreover, subject to avoiding contradiction, a person skilled in the art may combine different embodiments or examples described in the description and the features of the different embodiments or examples.

Although the embodiments of the present disclosure have already been illustrated and described above, it can be understood that the above embodiments are illustrative, and should not be construed as a limitation on the present disclosure, and a person skilled in the art may make variations, modifications, substitutions and improvements to the above embodiments within the scope of the present disclosure.

The invention claimed is:

1. A stretchable display panel, wherein the stretchable display panel comprises a displaying unit, a connecting unit and a hollowed-out region, the hollowed-out region is provided between the displaying unit and the connecting unit, and the stretchable display panel comprises:

film-layer components, wherein the film-layer components are in the displaying unit and the connecting unit;

a first planarization layer, wherein the first planarization layer is provided on one side of the film-layer components, and an orthographic projection of the first planarization layer on the film-layer components are within the displaying unit and the connecting unit;

a color-film layer, wherein the color-film layer is provided on one side of the first planarization layer that is away from the film-layer components, and an orthographic projection of the color-film layer on the film-layer components is within the displaying unit; and a color-film protecting layer, wherein the color-film protecting layer is provided on one side of the color-film layer that is away from the film-layer components, and covers merely the displaying unit and the connecting unit;

wherein the film-layer components comprise a flexible matrix, a flexible-matrix protecting layer, a thin-film-transistor component, a second planarization layer, a source-drain-electrode protecting layer, an organic luminescent component and a columnar supportor that are arranged in stack, orthographic projections of the flexible matrix, the flexible-matrix protecting layer and the second planarization layer on the film-layer components are within the displaying unit and the connecting unit, and orthographic projections of the thin-film-transistor component, the organic luminescent component and the columnar supportor on the film-layer components are within the displaying unit.

2. The stretchable display panel according to claim 1, wherein the stretchable display panel further comprises:

a substrate, wherein the substrate is provided on a surface of the film-layer components that is away from the first planarization layer.

3. The stretchable display panel according to claim 1, wherein the stretchable display panel further comprises:

a back film, wherein the back film is adhered to a surface of the film-layer components that is away from the first planarization layer.

4. The stretchable display panel according to claim 1, wherein a luminescent layer of the organic luminescent component is formed by using a white-light organic luminescent material, and an orthographic projection of the color-film layer on the film-layer components and an orthographic projection of the luminescent layer on the film-layer components overlap.

5. The stretchable display panel according to claim 1, wherein an anode of the organic-light-emitting-diode component is formed by using an integral material.

6. A stretchable display panel, wherein the stretchable display panel comprises a displaying unit, a connecting unit and a hollowed-out region, the hollowed-out region is provided between the displaying unit and the connecting unit, and the stretchable display panel comprises:

film-layer components, wherein the film-layer components are in the displaying unit and the connecting unit;

a first planarization layer, wherein the first planarization layer is provided on one side of the film-layer components, and an orthographic projection of the first planarization layer on the film-layer components are within the displaying unit and the connecting unit;

a color-film layer, wherein the color-film layer is provided on one side of the first planarization layer that is away from the film-layer components, and an orthographic projection of the color-film layer on the film-layer components is within the displaying unit; and a color-film protecting layer, wherein the color-film protecting layer is provided on one side of the color-film layer that is away from the film-layer components, and covers merely the displaying unit and the connecting unit;

wherein the film-layer components comprise a flexible matrix, a flexible-matrix protecting layer, a thin-film-transistor component, a second planarization layer, a source-drain-electrode protecting layer, an organic luminescent component and a columnar supportor that are arranged in stack, orthographic projections of the flexible matrix, the flexible-matrix protecting layer and the second planarization layer on the film-layer components are within the displaying unit and the connecting unit, and orthographic projections of the thin-film-transistor component, the organic luminescent component and the columnar supportor on the film-layer components are within the displaying unit;

wherein the first planarization layer directly covers a surface of the columnar supportor that is away from the flexible matrix.

* * * * *